(12) United States Patent
Chen

(10) Patent No.: US 6,869,833 B1
(45) Date of Patent: Mar. 22, 2005

(54) METHOD OF MANUFACTURING A THIN FILM TRANSISTOR OF A LIQUID CRYSTAL DISPLAY

(75) Inventor: Hung-De Chen, Fu-Chien (CN)

(73) Assignee: Quanta Display Inc., Tao-Yuan Hsien (TW)

( * ) Notice: Subject to any disclaimer, the term of this patent is extended or adjusted under 35 U.S.C. 154(b) by 0 days.

(21) Appl. No.: 10/708,620

(22) Filed: Mar. 16, 2004

(51) Int. Cl.[7] .............................................. H01L 21/00
(52) U.S. Cl. ........................ 438/158; 438/151; 438/30
(58) Field of Search .......................... 438/30, 151, 158, 438/609

(56) References Cited

U.S. PATENT DOCUMENTS

| 5,340,758 A | * | 8/1994 | Wei et al. .................... 438/158 |
| 5,874,326 A | * | 2/1999 | Lyu ............................ 438/158 |
| 5,998,230 A | * | 12/1999 | Gee-Sung et al. ............. 438/30 |
| 6,448,117 B1 | * | 9/2002 | Jen et al. ..................... 438/160 |
| 6,469,769 B2 | * | 10/2002 | Ozaki ........................... 349/187 |
| 6,620,719 B1 | * | 9/2003 | Andry et al. ................. 438/597 |
| 2002/0019082 A1 | * | 2/2002 | Wong .......................... 438/149 |

* cited by examiner

Primary Examiner—Matthew Smith
Assistant Examiner—Lex H. Malsawma
(74) Attorney, Agent, or Firm—Winston Hsu

(57) ABSTRACT

A method for fabricating a TFT having the steps of providing a substrate; sequentially depositing a transparent conductive layer, a first metal layer, a first insulating layer, a semiconductor layer, and a second metal layer on the substrate; performing a first photo-etching-process (PEP) to remove portions of the deposited layers to form a source electrode and a drain electrode and define a channel region, the first PEP includes a first halftone photolithograph process; depositing a second insulating layer and performing a second PEP to form a plurality of contact holes; and depositing a third metal layer and performing a third PEP to remove portions of the third metal layer.

19 Claims, 9 Drawing Sheets

A-A'   B-B'   C-C'   D-D'

METHOD OF MANUFACTURING A THIN FILM TRANSISTOR OF A LIQUID CRYSTAL DISPLAY

BACKGROUND OF INVENTION

1. Field of the Invention

The invention relates to a method of manufacturing a matrix device, and more particularly, to a method of manufacturing a thin film transistor liquid crystal display (TFT-LCD).

2. Description of the Prior Art

Since the progress of science and technology has led to small, effective, and portable intelligent information products, display devices have played an important role in modern society. In recent years, display devices have undergone great improvements in the areas of high performance quality, larger size, and lower cost. TFT-LCDs have characteristics of thinness, lightness and low power consumption and are expected to have in future a large market as a display device to replace CRTs. It is an important subject to develop a fabrication technique for realizing high achievement and low prices of TFT-LCDs.

Either for a conventional twist nematic (TN) LCD or for a recently developed wide view angle LCD, such as the IPS-LCD and the MVA-LCD, switch devices are required to control changes of the images. A popularly used switch device, TFT, includes a gate electrode, a source electrode, a drain electrode, and other needed semiconductor or insulating layers. The fabrication process of a TFT substantially decides the total process steps of a whole LCD, so simplifying the fabrication process of the TFT can realize low prices of TFT-LCDs.

The conventional fabrication method utilizes 5 or 4 masks to achieve a TFT in a liquid crystal display. The necessary elements of a TFT device include a source electrode, a drain electrode, a gate electrode and a channel region. For forming these necessary elements, the regular process steps are required and thus difficult to be omitted. However, with the application of halftone photolithograph making progress, the photo-etching-process can use a single mask to form photoresistors into different thicknesses. This makes reduction of the fabrication process possible.

SUMMARY OF INVENTION

It is therefore a primary objective of the claimed invention to provide a fabrication method of a thin film transistor to solve the above-mentioned problem to simplify the fabrication process thereof.

According to the claimed invention, a method for fabricating a thin film transistor (TFT) of a liquid crystal display (LCD) includes sequentially depositing a transparent conductive layer, a first metal layer, a first insulating layer, a semiconductor layer, and a second metal layer on a substrate. Following that, a first photo-etching-process (PEP) is performed to remove portions of the second metal layer, the semiconductor layer, the first insulating layer, the first metal layer, and the transparent conductive layer to form a source electrode and a drain electrode and define a channel region. A second insulating layer is deposited followed by performing a second PEP to remove portions of the second insulating layer to form a plurality of contact holes. Finally, a third metal layer is deposited to electrically connect the source electrode and the drain electrode with other wires, and a third PEP is performed to remove portions of the third metal layer. The first PEP includes a first halftone photolithograph process, and the first halftone photolithograph process forms a first photoresist layer and a second photoresist layer on the second metal layer.

According to the claimed invention, a method for fabricating a liquid crystal display (LCD) includes sequentially depositing a transparent conductive layer, a first metal layer, a first insulating layer, a semiconductor layer, and a second metal layer on a substrate. Following that, a first photo-etching-process (PEP) is performed to remove portions of the second metal layer, the semiconductor layer, the first insulating layer, the first metal layer, and the transparent conductive layer to form a gate line and a common line and define a TFT region, a channel region and a pixel electrode region. A second insulating layer is deposited followed by performing a second PEP to remove portions of the second insulating layer, the semiconductor layer, the first insulating layer, and the first metal layer to form a plurality of contact holes and expose portions of the transparent conductive layer. Finally, a third metal layer is deposited, and a third PEP is performed to form a data line and a capacitance region and electrically connect the TFT region and the pixel electrode region. The first PEP includes a first halftone photolithograph process, and the first halftone photolithograph process forms a first photoresist layer and a second photoresist layer on the second metal layer.

It is an advantage of the claimed invention that the fabrication method can simplify the process steps of the LCD, for example reduce the needed mask number from 4 or 5 to 3. Therefore, the present invention can realize low prices of TFT-LCDs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
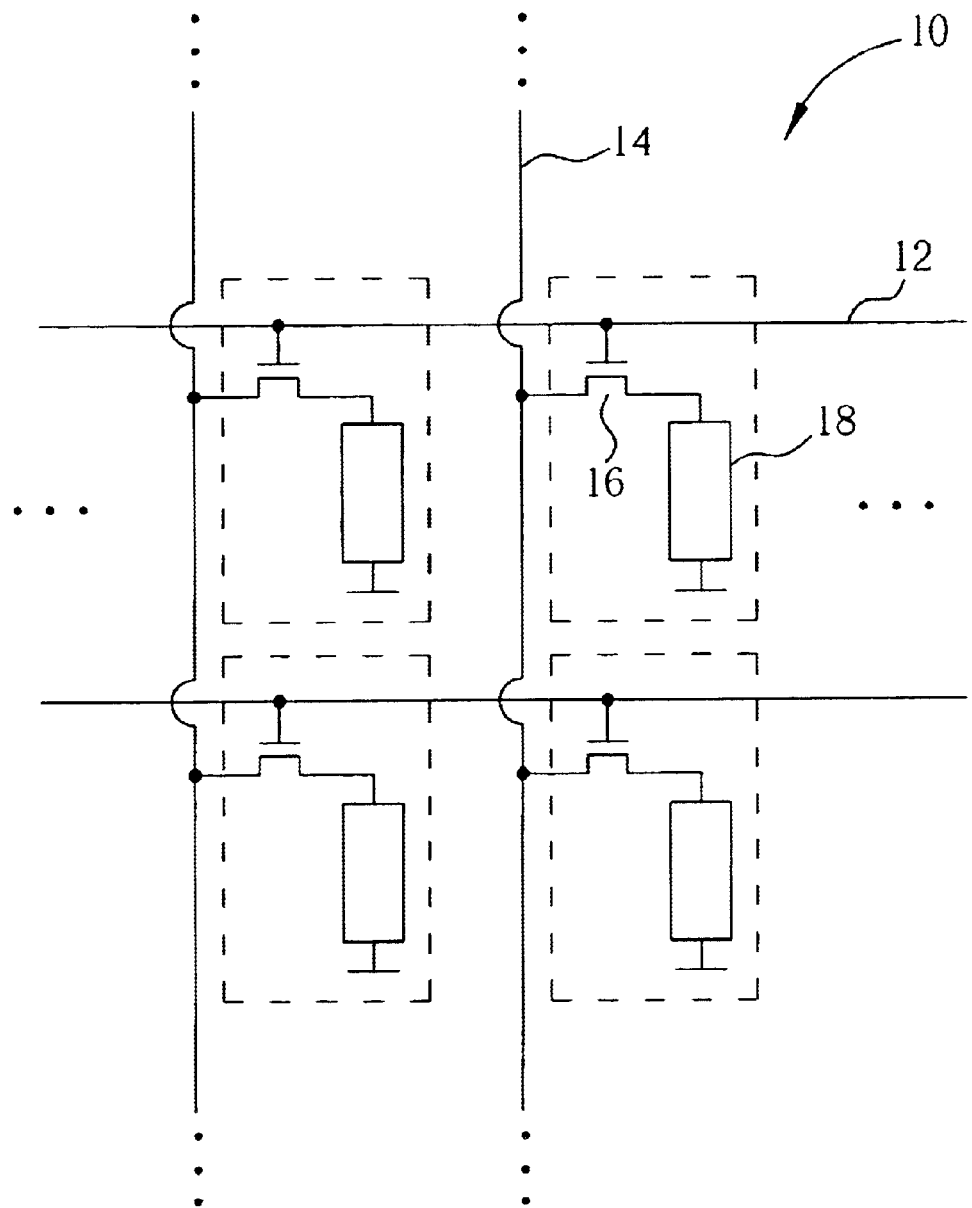
FIG. 1 is a schematic diagram of a liquid crystal display.

Please refer to FIG. 1, which is a schematic diagram of a liquid crystal display (LCD) 10. The LCD 10 comprises a plurality of gate lines 12, a plurality of data lines 14, a plurality of switch devices 16, and a plurality of pixel electrodes 18. Each switch device 16 is connected to a corresponding gate line 12 and a corresponding data line 14, and controls charging the connecting pixel electrode 18.

Figure 2:
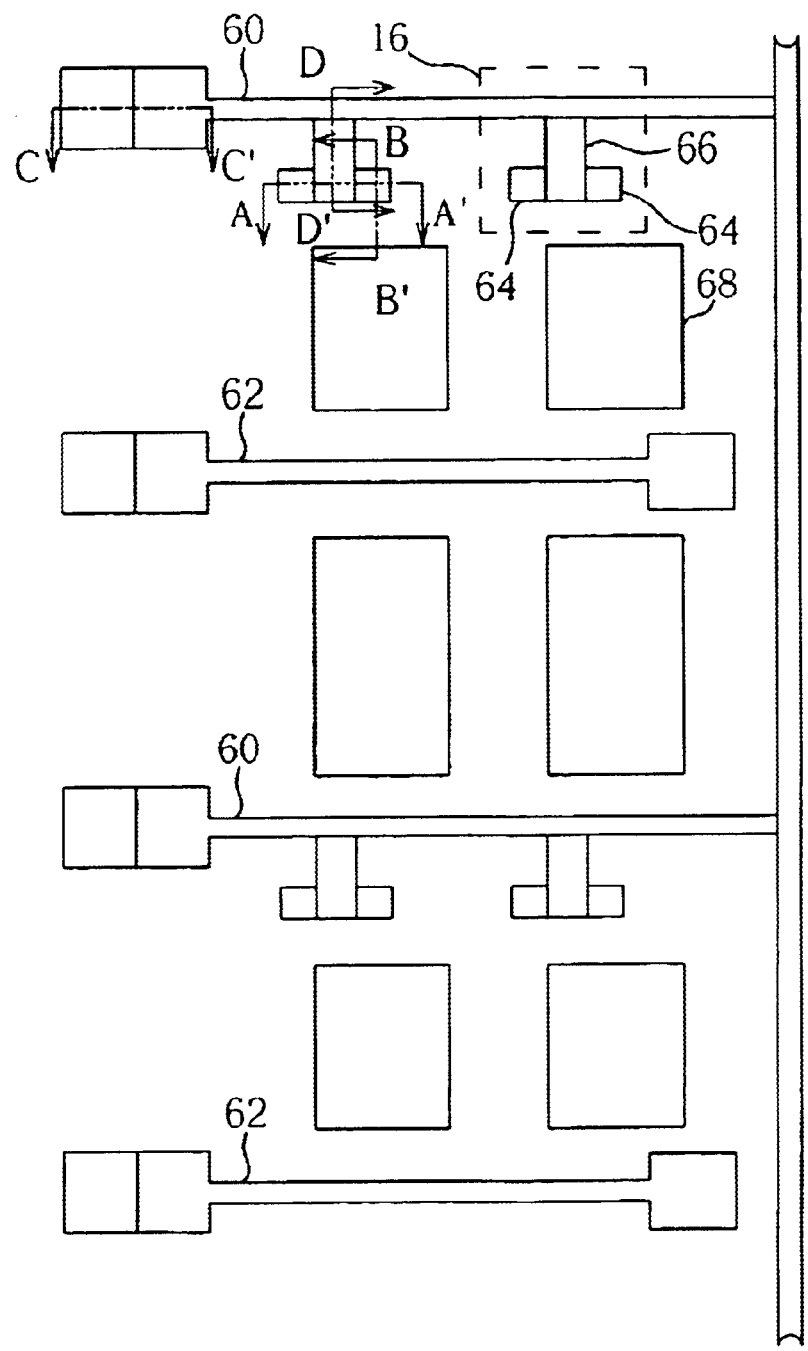
FIGS. 2–7 are schematic diagrams of a fabrication process of a liquid crystal display according to the present invention.
Figure 3:
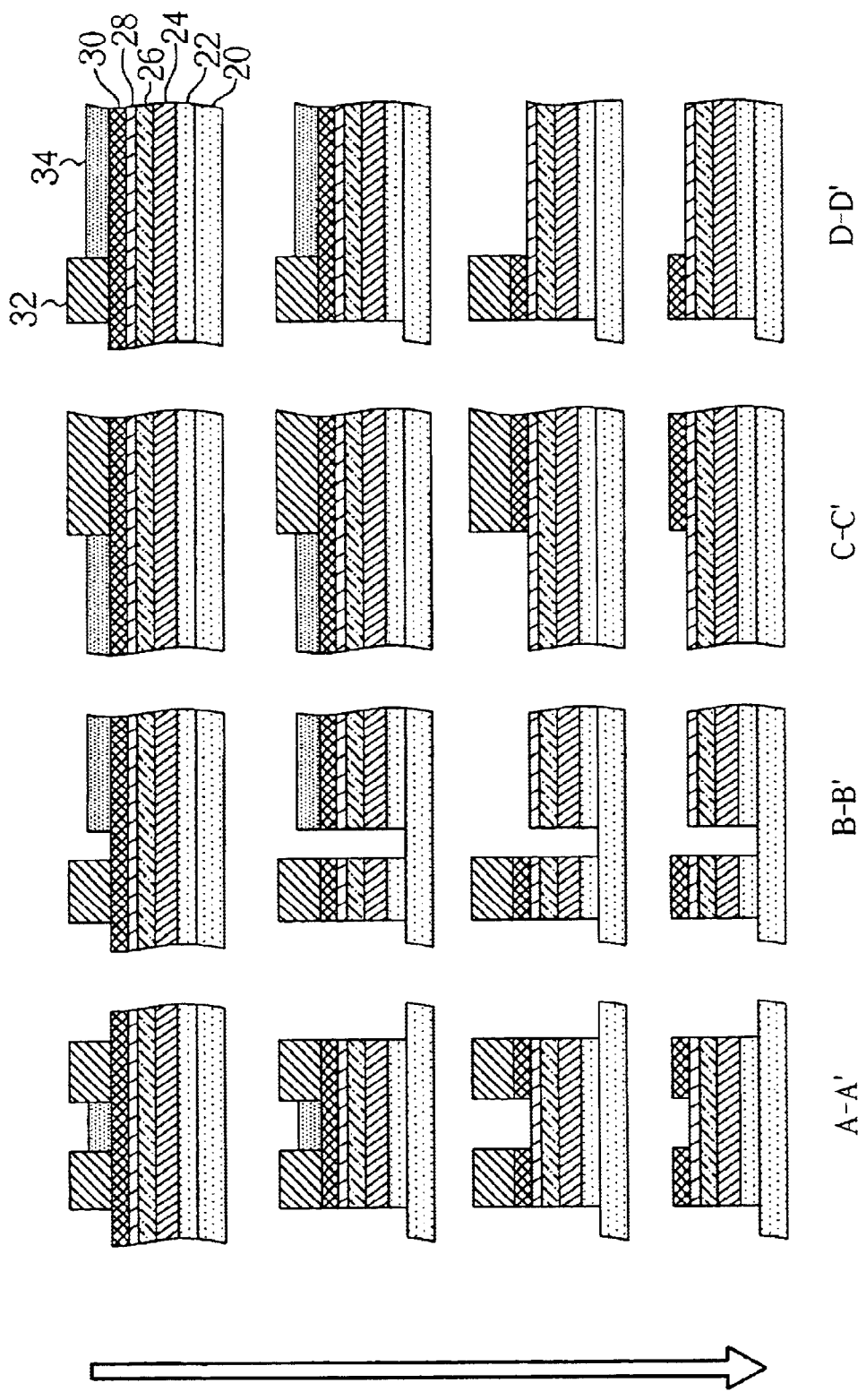

Please refer to FIGS. 2–7, which explicitly describe the fabrication process of the LCD 10. In the first preferred embodiment, for manufacturing the LCD 10, a transparent substrate 20 is provided. As shown in FIG. 3, a transparent conductive layer 22, a first metal layer 24, a first insulating layer 26, a semiconductor layer 28, and a second metal layer 30 are sequentially deposited on the substrate 20. After the deposition, a first photo-etching-process (PEP) is performed. The first PEP includes a first halftone photolithograph process, and forms two photoresistors having different thicknesses, such as a first photoresistor 32 and a second photoresistor 34. In the first halftone photolithograph process, a mask with slit patterns is irradiated by an electron beam or a laser. The pitches of the slit patterns are defined corresponding to the wavelength of the electron beam or the laser, and can form different thickness on different portions of the photoresistor layer. After exposing, the photoresisor layer is formed into two different thickness areas, a first photoresistor 32 and a second photoresistor 34. After forming the first photoresistor 32 and the second photoresistor 34, as shown in FIGS. 2 and 3, the first PEP further includes a first etching process to remove portions of the second metal layer 30, the semiconductor layer 28, the first insulating layer 26, the first metal layer 24, and the transparent conductive layer 22 and form a gate line 60 and a common line 62. Then, the second photoresistor 34 is removed and a second etching process is performed. Portions of the second metal layer 30 are removed to define a source/drain region 64, a channel region 66 and a pixel electrode region 68.

Figure 4:
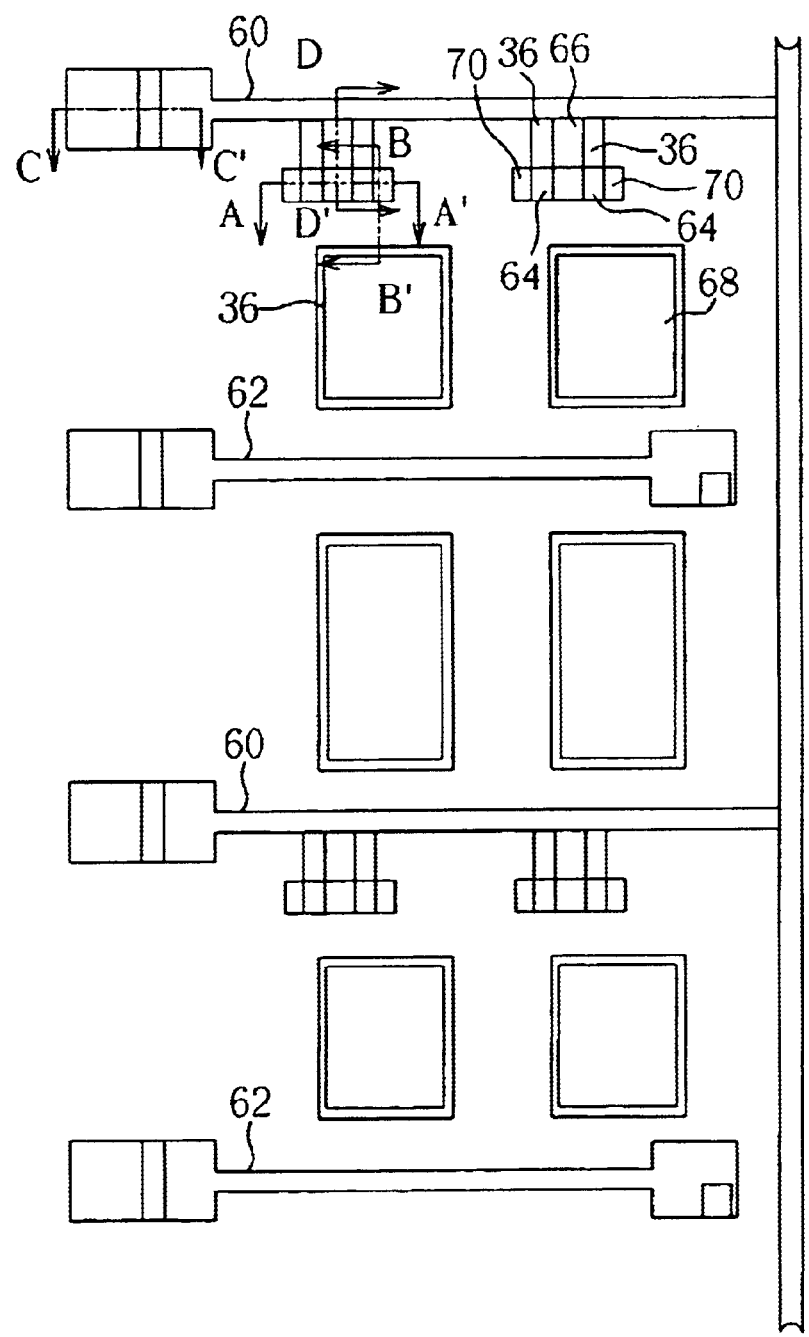
Figure 5:
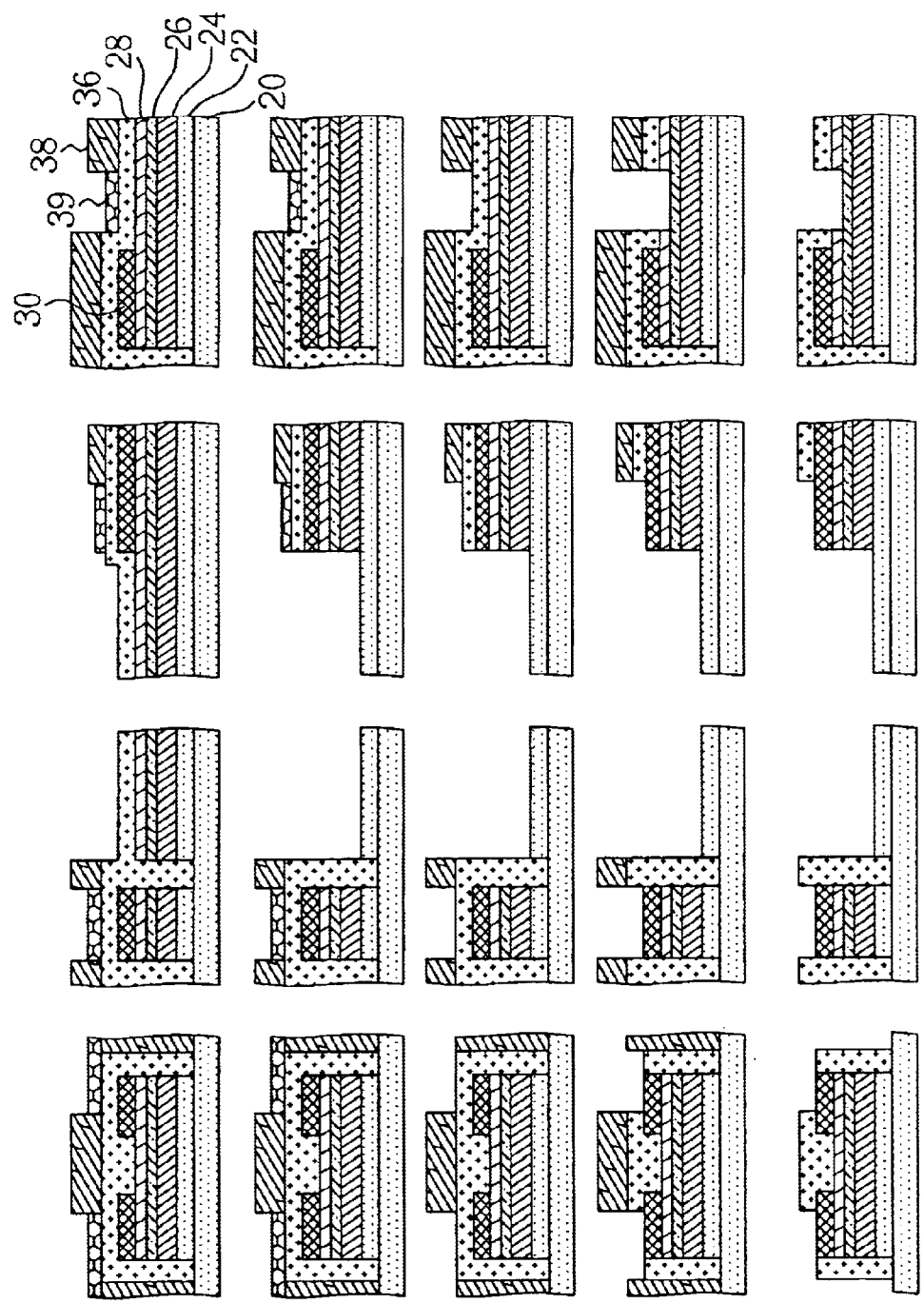

Please refer to FIGS. 4 and 5. After performing the first PEP, a second insulating layer 36 is deposited and a second PEP is performed. During proceeding the second PEP, a second halftone photolithograph process is performed to form a third photoresistor 38 and a fourth photoresistor 39. The third photoresistor 38 and the fourth photoresistor 39 are formed to define the pattern of the second insulating layer 36. Firstly, the second PEP uses a third etching process to remove portions of the second insulating layer 36, the semiconductor layer 28, the first insulating layer 26 and the first metal layer 24 uncovered by the third photoresistor 38 and the fourth photoresistor 39. Then, the fourth photoresistor 39 is removed, and portions of the second insulating layer 36 are removed to form a plurality of contact holes 70. After the second PEP process, portions of the transparent conductive layer 22 are exposed to fit the pattern of the pixel electrode region 68, and two contact holes 70 are formed on the exposed second metal layer 30 in the source/drain region 64.

Figure 6:
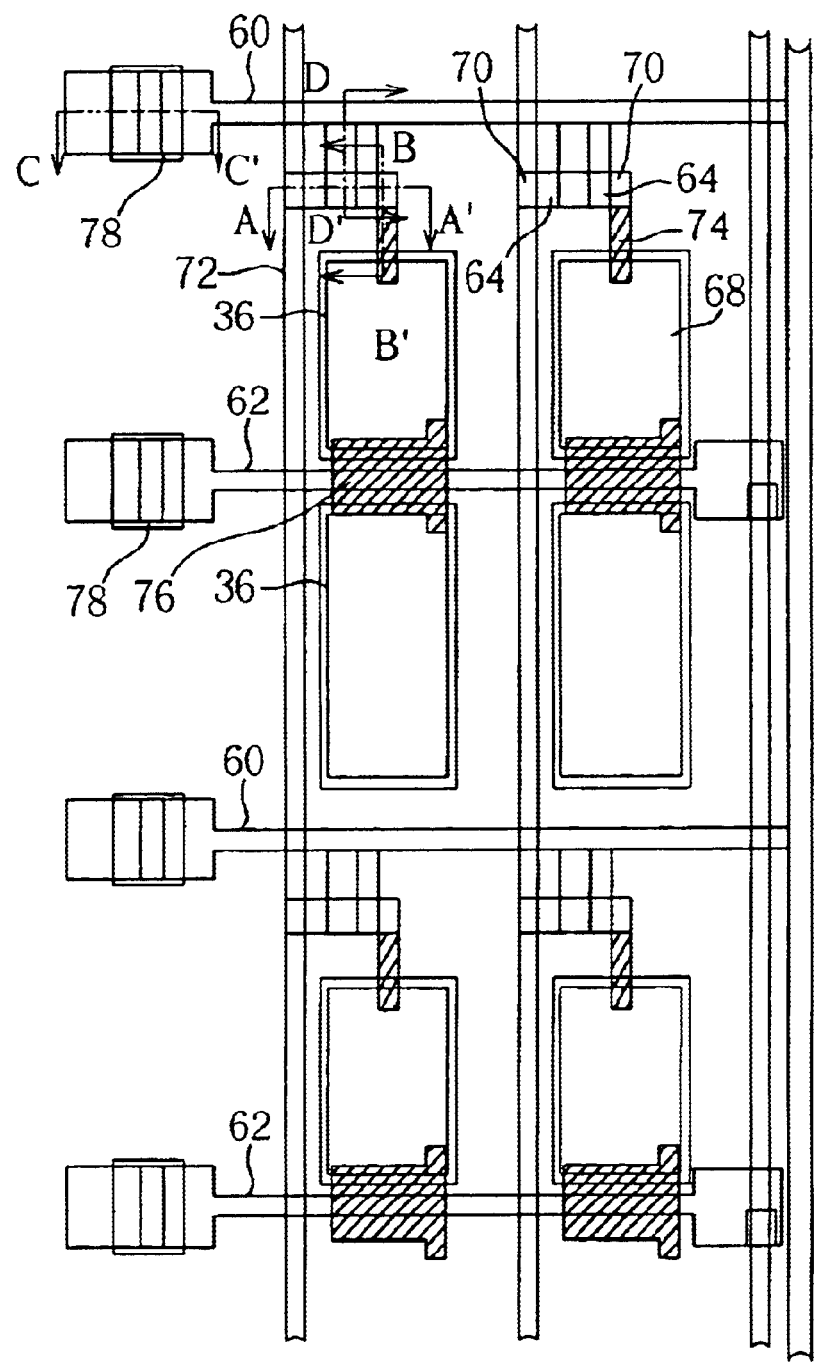
Figure 7:
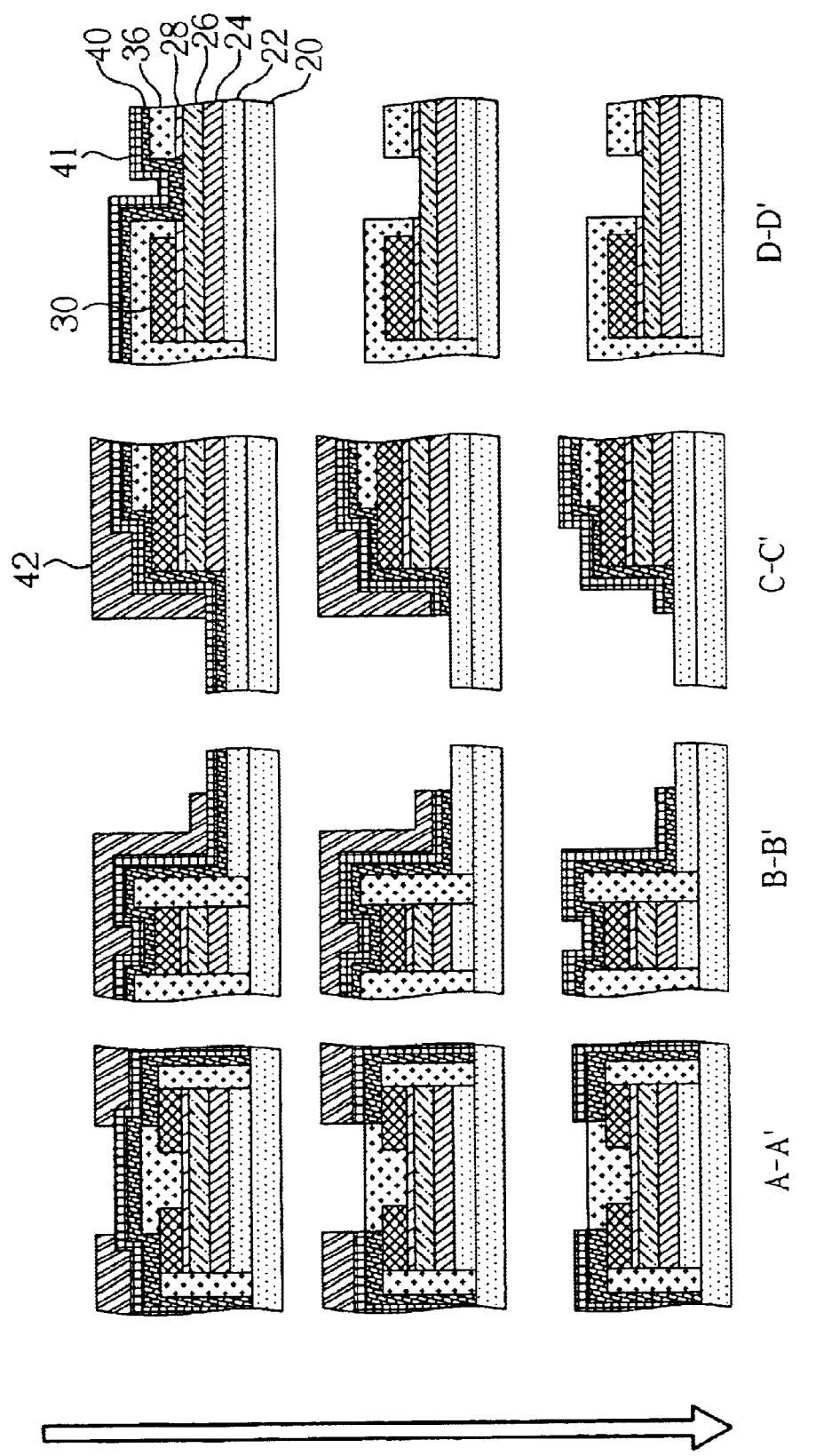

Please refer to FIGS. 6 and 7. After the second PEP, a third metal layer 40 and a passivation layer 41 are deposited and a third PEP is performed. Firstly, the third metal layer 40, the passivation layer 41 and a fifth photoresistor 42 are formed. Then, a fourth etching process is performed to remove portions of the third metal layer 40 and the passivation layer 41, and form a data line 72, a conduction region 74 and a capacitance region 76. The data line 72 electrically connects the source/drain region 64 through one of the contact hole 70, and the conduction region 74 conducts the source/drain region 64 and the pixel electrode region 68 through the other contact hole 70 formed in the source/drain region 64. As shown in FIGS. 6 and 7, peripheries of the two pixel electrode regions 68 positioned on two sides of the common line 62 and the common line 62 are covered with the second insulating layer 36. The third metal layer 40 strides across the common line 62 to electrically connect the two pixel electrode regions 68. The third metal layer 40 conducts the two pixel electrode regions 68 and forms the capacitance region 76 with the common line 62. In addition, in accordance with the requirements, the third metal layer 40 conducts the first metal layer 24 and the second metal layer 30 at a contact pad 78. The contact pad 78 is electrically connected to a driving circuit, a driving IC or a common voltage.

The present invention can be also achieved by another process. In the second preferred embodiment, the first PEP is similar to that in the first embodiment, but the second and third PEPs are different.

Figure 8:
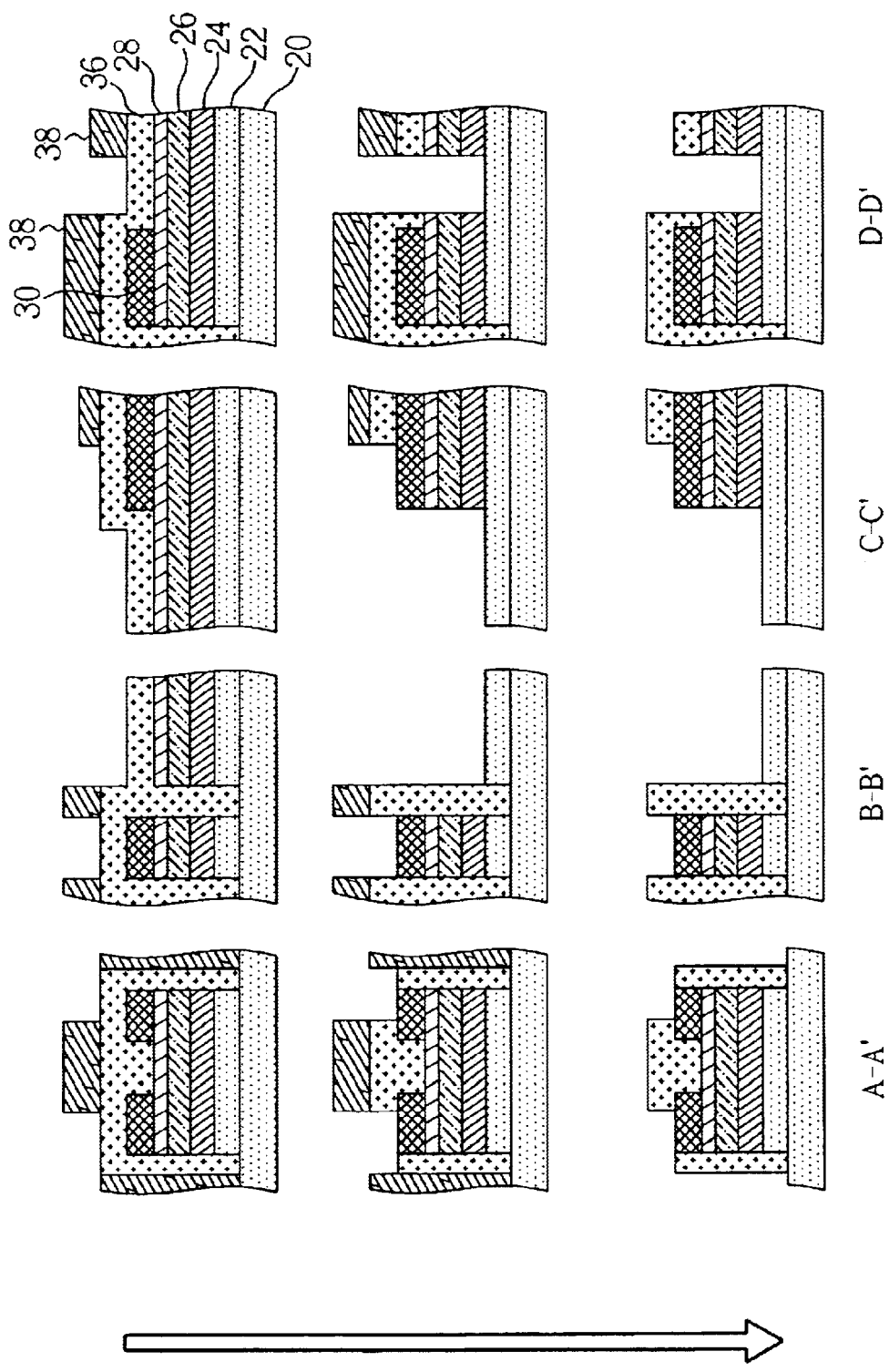
FIGS. 8–9 are schematic diagrams of another fabrication process of a liquid crystal display according to the present invention.

Please refer to FIG. 8. After performing the first PEP, a second insulating layer 36 is deposited and a different second PEP is performed. During proceeding the second PEP, only the third photoresistor 38 is formed to define the pattern of the second insulating layer 36. The second PEP uses a fifth etching process to remove portions of the second insulating layer 36, the semiconductor layer 28, the first insulating layer 26, and the first metal layer 24 uncovered by the third photoresistor 38 or the second metal layer 30. During proceeding the fifth etching process, a chemical solution with high etching selectivity is utilized to remove the first metal layer 24 and retain the second metal layer 30. Because of the chemical characteristics of the first metal layer 24 and the second metal layer 30, the selected solution can be only reacted with the first metal layer 24. After the second PEP, portions of the transparent conductive layer 22 are exposed to fit the pattern of the pixel electrode region 68, and two contact holes 70 are formed on the exposed second metal layer 30 in the source/drain region 64.

Figure 9:
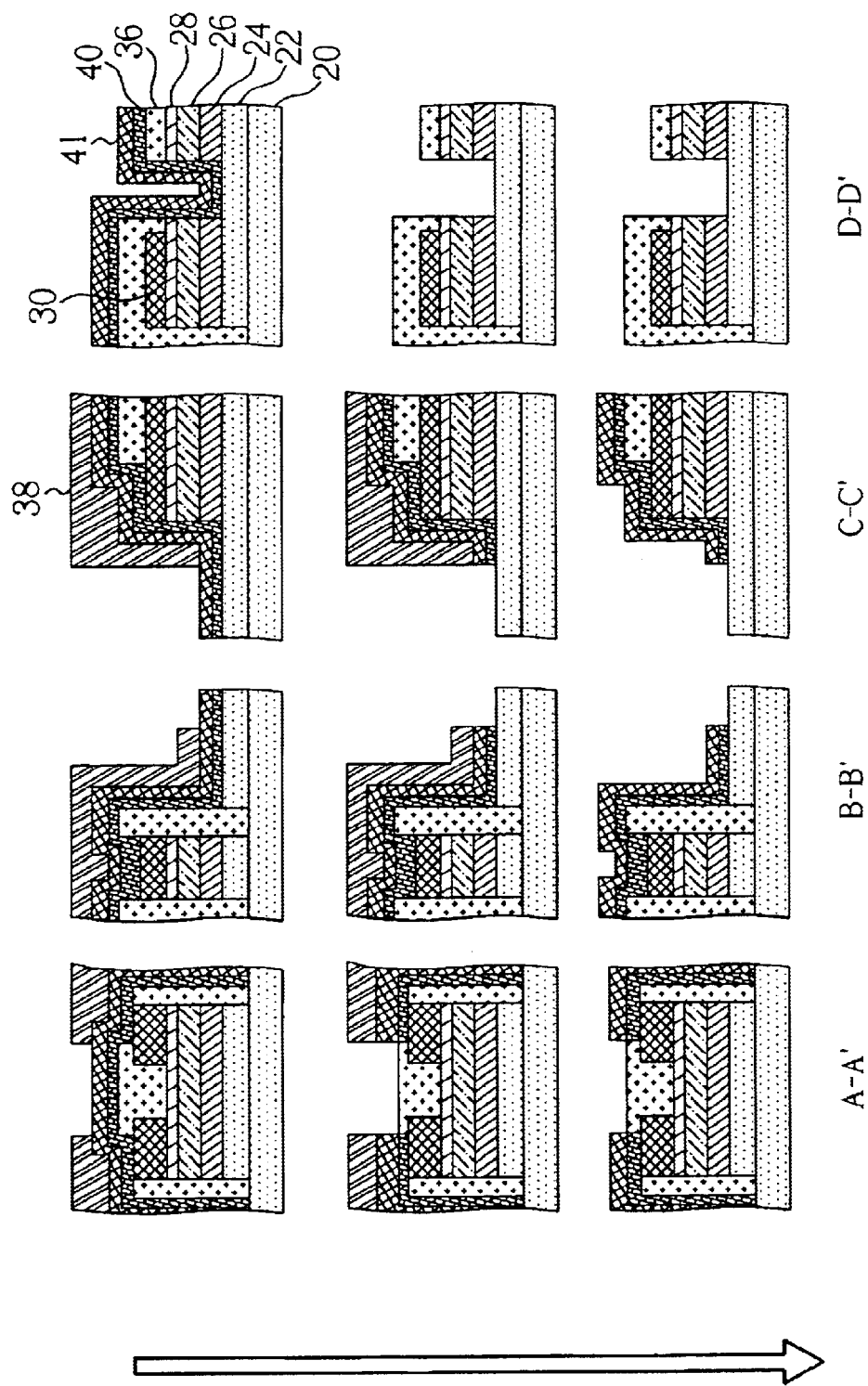

Please refer to FIG. 9. After the second PEP, a third metal layer 40 and a passivation layer 41 are deposited and a third PEP is also performed. Firstly, the third metal layer 40, the passivation layer 41 and a fifth photoresistor 42 are formed. Then, a sixth etching process is performed to remove portions of the third metal layer 40 and the passivation layer 41, and form a data line 72, a conduction region 74 and a capacitance region 76.

The substrate 20 is on condition that allows light to pass through, such as a glass substrate, a quartz substrate, or a plastic substrate. The transparent conductive layer 22 is an indium tin oxide (ITO) or an indium zinc oxide (IZO). The first metal layer 24, the second metal layer 30 and the third metal layer 40 are composed of tungsten (W), chromium (Cr), aluminum (Al), copper (Cu), molybdenum (Mo), or an alloy of any of the above metals.

The above-mentioned embodiment is explained with a general TN TFT-LCD, and the claimed fabrication process of other types LCD, such as STN TFT-LCD, IPS TFT-LCD or MVA TFT-LCD, is similar to that of the TN TFT-LCD. In contrast to the prior art, the present invention can simplify the process steps so that can realize low prices of TFT-LCDs.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating a thin film transistor (TM of a liquid crystal display (LCD), the method comprising the steps of:

providing a substrate;

sequentially depositing a transparent conductive layer, a first metal layer, a first insulating layer, a semiconductor layer, and a second metal layer on the substrate;

performing a first photo-etching-process (PEP) to remove portions of the second metal layer, the semiconductor layer, the first insulating layer, the first metal layer, and the transparent conductive layer to form a source electrode, a drain electrode and a channel region;

depositing a second insulating layer and performing a second PEP to remove portions of the second insulating layer to form a plurality of contact holes; and depositing a third metal layer for electrically connecting the source electrode and the drain electrode with other wires, depositing a passivation layer for protecting the third metal layer, and performing a third PEP to remove portions of the third metal layer and the passivation layer.

2. The method of claim 1 wherein the substrate comprises a glass substrate, a quartz substrate, or a plastic substrate.

3. The method of claim 1 wherein the first metal layer, the second metal layer and the third metal layer comprise tungsten (W), chromium (Cr), aluminum (Al), copper (Cu), molybdenum (Mo), or an alloy of any of the above metals.

4. The method of claim 1 wherein the transparent conductive layer comprises an indium tin oxide (ITO) or an indium zinc oxide (IZO).

5. The method of claim 1 wherein the first PEP includes a first halftone photolithograph process, the first halftone photolithograph process forming a first photoresistor layer and a second photoresistor layer on the second metal layer.

6. The method of claim 1 wherein the second PEP includes a second halftone photolithograph process.

7. The method of claim 1 wherein step of performing the second PEP further comprises:

performing a second halftone photolithograph process to form a third photoresistor layer and a fourth photoresistor layer on the second insulating layer;

removing portions of the second insulating layer, the semiconductor layer, the first insulating layer and the first metal layer uncovered by the third photoresistor layer and the fourth photoresistor layer;

removing the fourth photoresistor layer; and removing portions of the second insulating layer to form the contact holes.

8. The method of claim 1 wherein step of performing the second PEP further comprises:

forming a third photoresistor layer on the second insulating layer;

removing portions of the second insulating layer, the semiconductor layer, the first insulating layer, and the first metal layer uncovered by the third photoresistor layer or by the second metal layer.

9. The method of claim 8 wherein the second PEP includes a wet-etching process with a predetermined selectivity.

10. A method for fabricating a liquid crystal display (LCD), the method comprising the steps of:

providing a substrate;

sequentially depositing a transparent conductive layer, a first metal layer, a first insulating layer, a semiconductor layer, and a second metal layer on the substrate;

performing a first photo-etching-process (PEP) to remove portions of the second metal layer, the semiconductor layer, the first insulating layer, the first metal layer, and the transparent conductive layer to form a gate line and a common line, and define a TFT region, a channel region and a pixel electrode region;

depositing a second insulating layer and performing a second PEP to remove portions of the second insulating layer, the semiconductor layer, the first insulating layer, and the first metal layer to form a plurality of contact holes and expose portions of the transparent conductive layer; and depositing a third metal layer and a passivation layer, and performing a third PEP to form a data line and a capacitance region, and electrically connect the TFT region and the pixel electrode region.

11. The method of claim 10 wherein the substrate comprises a glass substrate, a quartz substrate, or a plastic substrate.

12. The method of claim 10 wherein the first metal layer, the second metal layer and the third metal layer are composed of tungsten (W), chromium (Cr), aluminum (Al), copper (Cu), molybdenum (Mo), or an alloy of any of the above metals.

13. The method of claim 10 wherein the transparent conductive layer comprises an indium tin oxide (ITO) or an indium zinc oxide (IZO).

14. The method of claim 10 wherein the first PEP includes a first halftone photolithograph process, the first halftone photolithograph process forming a first photoresistor layer and a second photoresistor layer on the second metal layer.

15. The method of claim 10 wherein the second PEP includes a second halftone photolithograph process.

16. The method of claim 10 wherein step of performing the second PEP further comprises:

performing a second halftone photolithograph process to form a third photoresistor layer and a fourth photoresistor layer on the second insulating layer;

removing portions of the second insulating layer, the semiconductor layer, the first insulating layer and the first metal layer uncovered by the third photoresistor layer and the fourth photoresistor layer;

removing the fourth photoresistor layer; and removing portions of the second insulating layer to form the contact holes.

17. The method of claim 10 wherein step of performing the second PEP further comprises:

forming a third photoresistor layer on the second insulating layer;

removing portions of the second insulating layer, the semiconductor layer, the first insulating layer, and the first metal layer uncovered by the third photoresistor layer or by the second metal layer.

18. The method of claim 17 wherein the second PEP includes a wet-etching process with a predetermined selectively.

19. The method of claim 10 wherein the third metal layer strides across the common line to electrically connect two pixel electrode regions.

* * * * *

UNITED STATES PATENT AND TRADEMARK OFFICE
CERTIFICATE OF CORRECTION

PATENT NO.         : 6,869,833 B1
APPLICATION NO.    : 10/708620
DATED              : March 22, 2005
INVENTOR(S)        : Hung-De Chen It is certified that error appears in the above-identified patent and that said Letters Patent is hereby corrected as shown below:

On the Title Page, Item (75), Inventors, the residence should be corrected from "Fu-Chien (CN)" to --Kinmen County (TW)--

Signed and Sealed this

Twenty-third Day of September, 2008

JON W. DUDAS
*Director of the United States Patent and Trademark Office*